United States Patent [19]
Koubuchi et al.

[11] Patent Number: 4,965,656
[45] Date of Patent: Oct. 23, 1990

[54] SEMICONDUCTOR DEVICE

[75] Inventors: Yasushi Koubuchi; Jin Onuki; Masahiro Koizumi, all of Hitachi, Japan

[73] Assignee: Hitachi, Ltd., Tokyo, Japan

[21] Appl. No.: 314,246

[22] Filed: Feb. 21, 1989

Related U.S. Application Data

[63] Continuation of Ser. No. 58,321, Jun. 4, 1987, abandoned.

[30] Foreign Application Priority Data

Jun. 6, 1986 [JP] Japan ................................ 61-130149

[51] Int. Cl.$^5$ ............................................ H01L 23/48
[52] U.S. Cl. ......................................... 357/71; 357/2; 357/67; 437/190
[58] Field of Search ............... 357/71, 2, 67; 437/190, 437/192, 194

[56] References Cited

U.S. PATENT DOCUMENTS 4,201,999  5/1980  Howard et al. ...................... 357/67
4,350,994  9/1982  Perpezko et al. .................... 357/2
4,546,373 10/1985  Todd et al. .......................... 357/2
4,668,310  5/1987  Kudo et al. ........................ 420/126

FOREIGN PATENT DOCUMENTS 2457484  7/1975  Fed. Rep. of Germany ........ 357/67
56-135927 10/1981  Japan ................................ 437/192
2130793  6/1984  United Kingdom .

OTHER PUBLICATIONS

Nouvau Traite de Chemie Minerale Masson et Cie, Paris 1963, p. 814, 1205, 2093, 2094, 2288.
Physical Review B vol. 32 #2 pp. 1363-1365 by Barbour, Jul. 15, 1985.
Applied Physics Letters vol. 22, #2 pp. 81-83 by Kircher, 1/15/73.
Solid State Electronics, vol. 26, #6 pp. 507-513 by Todd et al., 6/27/84.
Journal of Applied Physics, vol. 53 #7, pp. 6186-6190 by Doyle et al., 9/82.
IEEE Electron Device Letters, vol. 6 #8, pp. 437-438 by Remba et al., 8/85.
Buschow et al, "Thermal Stability and Electronic Properties of Amorphous Zr-Co and Zr-Ni Alloys", Phy. Rev. B, vol. 19, #8, Apr. 15, 1979, pp. 3843-3849.

Primary Examiner—Andrew J. James
Assistant Examiner—Mark Prenty
Attorney, Agent, or Firm—Antonelli, Terry, Stout & Kraus

[57] ABSTRACT

This invention provides a semiconductor device having an electrode conductor layer on a semiconductor substrate through the medium of a diffusion barrier layer, comprising the diffusion barrier layer formed of an amorphous material having a higher crystallization temperature than the heat treatment temperature for the semiconductor device. According to this invention, the reaction between the metal conductor and the semiconductor substrate and the diffusion of the conductor material into the semiconductor substrate can be prevented and resultantly a semiconductor device having a high thermal reliability can be obtained.

12 Claims, 1 Drawing Sheet

SEMICONDUCTOR DEVICE

This application is a Continuation application of application Ser. No. 058,321, filed June 4, 1987, now abandoned.

BACKGROUND OF THE INVENTION

1. Field of the Invention

This invention relates to a semiconductor device. Especially it relates to providing semiconductor devices of integrated circuits (ICs) or large scale integrated circuits (LSIs). More particularly, it relates to a semiconductor device having electrode conductors formed of aluminum or aluminum-silicon alloy.

2. Description of the Prior Art

When an electronic circuit is constructed by connecting a transistor, diode etc. formed in a silicon semiconductor substrate, usually aluminum film conductors and a heat treatment are applied, after the interconnecting conductors have been formed, for the purpose of decreasing the contact resistance between the conductors and the substrate. The heat treatment is carried out at a temperature which does not cause the melting of the aluminum conductors, usually at about 400° to 500° C.

It is known that the silicon semiconductor substrates and the aluminum conductors diffuse into each other during the heat treatment. If aluminum diffuses up to the junction part which forms the transistor, diode, etc., the junction is broken and resultantly the intended electronic circuit cannot be constructed.

It is already known to use conductors of an aluminum-silicon alloy in which silicon contained corresponding to the solid solubility limit for aluminum or more, in order to prevent the mutual diffusion of the aluminum conductors and the silicon semiconductor substrate. However, a satisfactory result has not been obtained by this method.

Japanese patent Application Kokai (Laid-Open) No. 48,249/82 discloses to provide a titanium nitride layer at the interface between a silicon semiconductor substrate and an aluminum conductor to prevent the mutual diffusion of the two. Further, Japanese patent application Kokai (Laid-Open) No. 210,838/85 discloses to form a platinum silicide layer or a palladium silicide layer at the interface between a silicon semiconductor substrate and an aluminum conductor.

However, according to the study of the present inventors, when a titanium nitride layer is provided, it is ineffective unless it has a large thickness of about several $\mu$m. If it has a small thickness of about 0.1 $\mu$m aluminum and silicon diffuse into each other through the grain boundary of titanium nitride matrix. A thick titanium nitride layer of several $\mu$m thickness is unfavorable because it causes an increase in contact resistance.

When a platinum silicide layer or a palladium silicide layer is provided, because it is prepared as described in Japanese patent application Kokai (Laid-Open) No. 210,838/85 by forming a platinum layer or a palladium layer on a silicon semiconductor substrate, then depositing silicon thereon and making the two react with each other, the production process is complicated and is not useful in practice. Further, the use of platinum or palladium causes an increase in the cost of the resulting semiconductor device.

SUMMARY OF THE INVENTION

Object of the Invention

The object of this invention is to provide a semiconductor device which has a novel diffusion barrier layer to give a diffusion prevention effect higher than that obtainable by the prior art mentioned above.

Statement of the Invention

The above-mentioned object can be attained by using, for a diffusion barrier layer, an amorphous material which has a higher crystallization temperature than the temperature of the heat treatment applied after the formation of an electrode conductor layer. More specifically, it can be attained by using an amorphous material which has a crystallization temperature higher than the melting point of the electrode conductor material, because the heat treatment after the formation of the electrode conductor layer is carried out at a temperature not more than the melting point of the electrode conductor material.

This invention is based on the finding of the fact that so long as a crystalline material is used for the diffusion barrier layer, diffusion takes place through the crystal grain boundaries.

Based on the finding, the present inventors have attained the present invention in which the diffusion barrier layer is formed with an amorphous material.

Diffusion barrier layers of the prior art comprising titanium nitride, or platinum silicide or palladium silicide, also have an effect of suppressing, to some extent, the diffusion between the aluminum conductors and the silicon semiconductor substrates. However, the crystal grain boundaries of the diffusion barrier layer are going to be a diffusion path during the heat treatment conducted after the formation of an electrode conductor layer, giving rise inevitably to some extent of diffusion. Increasing the thickness of the diffusion barrier layer to prevent the diffusion through grain boundaries causes an increase in the contact resistance between aluminum and the silicon semiconductor substrate.

When an amorphous material having no crystal grain boundary which would constitute a diffusion path is used for a diffusion barrier layer and further when the crystallization temperature of the amorphous material is higher than the heat treatment temperature of the semiconductor device, the amorphous diffusion barrier layer is thermodynamically stable and can effectively prevent the diffusion between the electrode conductor and the semiconductor substrate. Further, since a very high diffusion prevention effect is obtained by this method, the thickness of the diffusion barrier layer can be decreased and resultantly the contact resistance between aluminum and the substrate can be lowered.

Experiments conducted by using various amorphous materials have revealed that a diffusion barrier layer with a thickness of 0.1 $\mu$m or less gives a sufficient effect and also causes no problem in respect of contact resistance. The amorphous material diffusion barrier layer has preferably a thickness in the range of 0.003 to 0.3 $\mu$m. It is difficult to prepare a thin layer of thickness below 0.003 $\mu$m, which also is poor in reliability in respect of diffusion prevention. A thick layer of more than 0.3 $\mu$m in thickness is unnecessary and, rather, makes the formation of the device on the electrode conductors difficult.

On investigation of amorphous materials which are thermodynamically stable and do not crystallize at the heat treatment temperature for a semiconductor device, it has been found that a satisfactory result can be obtained by combining two or more kinds of metals of a high melting point. More specifically, satisfactory results have been obtained by combination of metals having a melting point of 1000° C. or more. Example of such metals include beryllium, boron, silicon, titanium manganese, iron, cobalt, nickel, zirconium, niobium, molybdenum, copper, yttrium, ruthenium, rhodium, palladium, hafnium, tantalum, tungsten, rhenium, iridium, thorium, samarium, gadolinium, and terbium. Amorphous materials comprising an alloy, or a compound, of two or more metals selected from these are satisfactory for the diffusion barrier layer. A single component alone cannot form an amorphous material and is hence ineffective.

The above-mentioned metallic elements are preferably used in a combination which allows a eutectic reaction to take place and is in a eutectic composition or in the neighborhood thereof. An alloy having a eutectic composition or a composition near thereto can be readily turned from the gas phase directly into the solid phase by quenching, and hence tends to become amorphous.

Amorphous materials of the following combinations were tested in practice and all showed a fully satisfactory performance. Accordingly, the following combinations are very favorable.

Combinations of cobalt and titanium; copper and titanium; iron and zirconium; hafnium and cobalt hafnium and nickel; nickel and zirconium; titanium and nickel; zirconium and cobalt; zirconium and palladium; titanium, beryllium and zirconium; and zirconium, beryllium and niobium.

Table 1 shows the eutectic composition and the preferably component composition range of alloys of the above-mentioned combinations.

TABLE 1

| Diffusion barrier layer material | Component composition (atomic %) | Eutectic composition (atomic %) |
| --- | --- | --- |
| Co—Ti alloy | Co-10–30% Ti | Co-22% Ti |
| Cu—Ti alloy | Cu-15–50% Ti | Cu-30% Ti |
| Fe—Zr alloy | Fe-5–20% Zr | Fe-10% Zr |
| Fe—Zr alloy | Fe-60–80% Zr | Fe-76% Zr |
| Hf—Co alloy | Hf-50–70% Co | Hf-67% Co |
| Hf—Ni alloy | Hf-50–70% Ni | Hf-67% Ni |
| Ti—Ni alloy | Ti-15–35% Ni | Ti-25% Ni |
| Zr—Co alloy | Zr-5–12% Co | Zr-8% Co |
| Zr—Ni alloy | Zr-10–50% Ni | Zr-24% Ni |
| Zr—Pd alloy | Zr-30–80% Pd | Zr-50% Pd |
| Ti—Be—Zr alloy | Ti-24–55% Be-5–30% Zr | Ti-40% Be-10% Zr |
| Zr—Be—Nb alloy | Zr-15–45% Be-5–30% Nb | Zr-30% Be-10% Nb |

Amorphous alloys or amorphous compounds can be formed by depositing the alloys or compounds onto a semiconductor substrate by means of sputtering. The alloys or compounds can be made amorphous by utilizing the effect of quenching when they are deposited onto the semiconductor substrate from a plasma state.

Amorphous alloys or amorphous compounds can be formed, besides by sputtering, also by means of vapor deposition or chemical vapor deposition (CVD).

EXAMPLES

Figure 1:
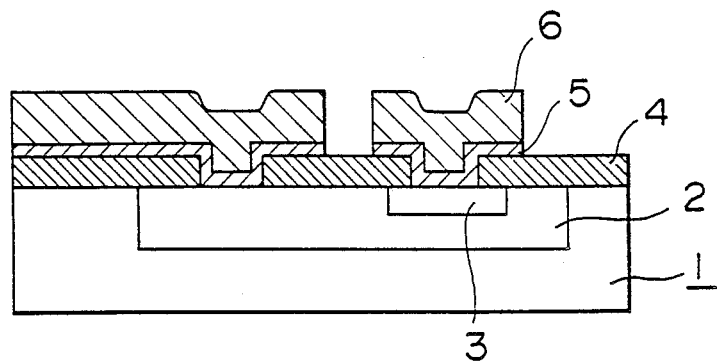
FIG. 1 is a sectional structural drawing of the principal part in one embodiment of this invention.
Figure 2:
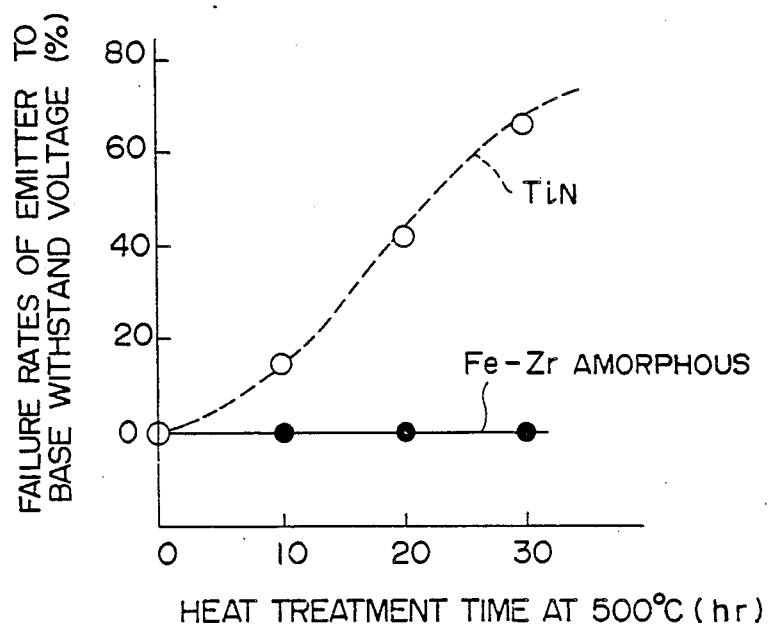
FIG. 2 is a characteristics diagram showing the evaluation results of the thermal resistance of the emitter to base withstand voltage of the device shown in FIG. 1 in comparison with those obtained by the prior method.

This invention will be described below with reference to Examples. FIG. 1 is a sectional view of a transistor to which this invention has been applied. An n-type silicon substrate 1 has a p-type base region 2 and an n-type emitter region 3 on its surface. A silicon oxide film 4 is formed on the surface of the p-type base region and the n-type emitter region. The formation of the silicon oxide film was conducted by heating the silicon substrate at about 1000° C. making thermal oxidation of its surface. The silicon oxide film has a thickness of 0.5 μm. Then, a contact hale was formed in the silicon oxide film 4, and a diffusion barrier layer 5 comprising an amorphous material was formed in 0.01 μm thickness and an aluminum conductor layer 6 was formed in 0.8 μm thickness. Combinations having the component compositions shown in Table 2 were chosen for the amorphous materials. The materials shown in Table 2 were sputtered and turned into the amorphous state by utilizing the effect of quenching when deposited from their plasma state onto the silicon substrate and the silicon oxide film. The sputtering conditions were, both for the formation of the diffusion barrier layer and for the formation of the aluminum conductor layer, argon gas pressure of 0.5 Pa and output RF of 2 kW.

Thereafter, part of the amorphous material and of the aluminum conductor layer 6 were dry-etched until to reach the silicon oxide film 4 by means of commonly used photolithography. The etching conditions were as follows, CCl$_4$ gas pressure of 5 Pa and RF output power 100 W. The reaction between the silicon semiconductor substrate and the aluminum conductor layer 6 at the contact hale of the silicon oxide film 4 can be suppressed by thus providing a diffusion barrier layer. Further, since the diffusion of aluminum (Al) atoms into the silicon semiconductor substrate can be prevented with the diffusion barrier layer 5 formed of the amorphous material, the thermal reliability of the junction characteristics between the emitter and the base can be drastically improved.

In the combination of iron (Fe) with zirconium (Zr), it is particularly preferable to control the content of Zr to 9–11 atomic % and the thickness of the amorphous layer to 200–1,000 Å.

Table 2 shows the "thermal resistance temperature" and the electric resistance of the ohmic contact part of the electrode conductor and the silicon substrate for cases wherein various diffusion barrier layer materials were used. The "thermal resistance temperature" is the temperature at which 1% of junction failure between the emitter and the base occurs after one hour of heating at the temperature; and the higher it is the better. The electric resistance is the value obtained after one hour of heating at 450° C.; and the lower, the better.

Table 2 shows thermal resistance temperature and electric resistance also for a case wherein a titanium nitride layer was formed to a thickness of 0.01 μm as the diffusion barrier layer and a case wherein an aluminum 1.8 atomic % silicon alloy conductor was used without a diffusion barrier layer. The titanium nitride layer was formed by means of sputtering using a titanium conductions of N$_2$ pressure of 5 Pa and output RF of 2 kW.

TABLE 2

| Diffusion barrier layer material (atomic %) | Thermal resistance temperature (°C.) | Electric resistance (Ω/μm²) |
| --- | --- | --- |
| Co-22% Ti | 505 | 80 |
| Cu-33% TI | 480 | 95 |
| Fe-10% Zr | 520 | 90 |
| Fe-67% Zr | 535 | 85 |
| Hf-50% Co | 495 | 100 |
| He-50 TNi | 475 | 105 |
| Ti-33% Ni | 500 | 120 |
| Zr-10% Co | 510 | 85 |
| Zr-50% Ni | 490 | 95 |
| Zr-30% Pd | 485 | 105 |
| Ti-40% Be-10% Zr | 510 | 85 |
| Zr-30% Be-10% Nb | 530 | 80 |
| No diffusion barrier layer | 380 | 1300 |
| TiN | 400 | 200 |

Table 3 shows the failure rate of the emitter to base junction after 1 hour, 10 hours and 100 hours of heating at 450° C. after the formation of electrode conductor.

TABLE 3

| Diffusion barrier layer material (atomic %) | Failure rate of emitter to base junction after heating at 450° C. | | |
| --- | --- | --- | --- |
|  | 1 hr | 10 hr | 100 hr |
| Co-22% Ti | 0 | 0 | 0 |
| Cu-33% Ti | 0 | 0.2 | 1 |
| Fe-10% Zr | 0 | 0 | 0 |
| Fe-67% Zr | 0 | 0 | 1 |
| Hf-50% Co | 0 | 0.2 | 1 |
| Hf-50% Ni | 0 | 0.4 | 1 |
| Ti-33% Ni | 0 | 0 | 0 |
| Zr-10% Co | 0 | 0 | 0 |
| Zr-50% Ni | 0 | 0.4 | 1 |
| Zr-30% Pd | 0 | 0.1 | 0.4 |
| Ti-40% Be-10% Zr | 0 | 0 | 0 |
| Zr-30% Be-10% Nb | 0 | 0 | 0 |
| No diffusion barrier layer | 5 | 23 | 100 |
| TiN | 0.2 | 2 | 13 |

It has been confirmed from Table 3 that those which have diffusion barrier layers formed of amorphous materials show low failure rates of emitter to base junction as compared with the one which has a TiN layer as the diffusion barrier layer and the one which has no diffusion barrier layer using an Al-1.8 atomic % Si alloy conductor.

What is claimed is:

1. A semiconductor device comprising a semiconductor substrate of silicon, having integrated circuits therein, a diffusion barrier layer formed on said substrate, and an electrode conductor layer formed of aluminum or aluminum-silicon alloy on said diffusion barrier layer, wherein the diffusion barrier layer is an amorphous material layer formed of an amorphous material having a higher crystallization temperature than a temperature of any heat treatment applied to said semiconductor device after the formation of the amorphous material layer, the amorphous material being of an alloy, or a compound, of at least two metals selected from the group consisting of beryllium, boron, silicon, titanium, manganese, iron, cobalt, nickel, copper, yttrium, zirconium, niobium, molybdenum, ruthenium, rhodium, palladium, hafnium, tantalum, tungsten, rhenium, iridium, thorium, samarium, gadolinium, and terbium, the at least two metals being in a eutectic composition.

2. A semiconductor device having, on a semiconductor substrate of silicon and through the medium of a diffusion barrier layer, an electrode conductor layer formed of aluminum or aluminum-silicon alloy, comprising the diffusion barrier layer formed of an amorphous material of a copper- 15 to 50 atomic % titanium alloy.

3. A semiconductor device having, on a semiconductor substrate of silicon and through the medium of a diffusion barrier layer, an electrode conductor layer formed of aluminum or aluminum-silicon alloy, comprising the diffusion barrier layer formed of an amorphous material of an iron- 5 to 20 atomic % zirconium alloy.

4. A semiconductor device having, on a semiconductor substrate of silicon and through the medium of a diffusion barrier layer, an electrode conductor layer formed of aluminum or aluminum-silicon alloy, comprising the diffusion barrier layer formed of an amorphous material of an iron- 60 to 80 atomic % zirconium alloy.

5. A semiconductor device having, on a semiconductor substrate of silicon and through the medium of a diffusion barrier layer, an electrode conductor layer formed of aluminum or aluminum-silicon alloy, comprising the diffusion barrier layer formed of an amorphous material of a hafnium- 50 to 70 atomic % cobalt alloy.

6. A semiconductor device having, on a semiconductor substrate of silicon and through the medium of a diffusion barrier layer, an electrode conductor layer formed of aluminum or aluminum-silicon alloy, comprising the diffusion barrier layer formed of an amorphous material of a hafnium - 50 to 70 atomic % nickel alloy.

7. A semiconductor device having, on a semiconductor substrate of silicon and through the medium of a diffusion barrier layer, an electrode conductor layer formed of aluminum or aluminum-silicon alloy, comprising the diffusion barrier layer formed of an amorphous material of a zirconium-5 to 12 atomic % cobalt alloy.

8. A semiconductor device having, on a semiconductor substrate of silicon and through the medium of a diffusion barrier layer, an electrode conductor layer formed of aluminum or aluminum-silicon alloy, comprising the diffusion barrier layer formed of an amorphous material of a zirconium - 10 to 50 atomic % nickel alloy.

9. A semiconductor device having, on a semiconductor substrate silicon and through the medium of a diffusion barrier layer, an electrode conductor layer formed of aluminum or aluminum-silicon alloy, comprising the diffusion barrier layer formed of an amorphous material of a zirconium- 30 to 80 atomic % palladium alloy.

10. A semiconductor device having, on a semiconductor substrate silicon and through the medium of a diffusion barrier layer, an electrode conductor layer formed of aluminum or aluminum-silicon alloy, comprising the diffusion barrier layer formed of an amorphous material of a titanium- 24 to 55 atomic % beryllium - 5 to 30 atomic % zirconium alloy.

11. A semiconductor device having, on a semiconductor substrate silicon and through the medium of a diffusion barrier layer, an electrode conductor layer formed of aluminum or aluminum-silicon alloy, comprising the diffusion barrier layer formed of an amorphous material of a zirconium- 15 to 45 atomic % beryllium- 5 to 30 atomic % niobium alloy.

12. A semiconductor device having, on a semiconductor substrate of silicon and through the medium of a diffusion barrier layer, an electrode conductor layer formed of aluminum or aluminum-silicon alloy, comprising the diffusion barrier layer formed of an amorphous material of a cobalt- 10 to 30 atomic % titanium alloy.

* * * * *